(12) United States Patent
Kim et al.

(10) Patent No.: US 7,704,680 B2
(45) Date of Patent: Apr. 27, 2010

(54) DOUBLE EXPOSURE TECHNOLOGY USING HIGH ETCHING SELECTIVITY

(75) Inventors: Ryoung-Han Kim, San Jose, CA (US); Jong-wook Kye, Pleasanton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 946 days.

(21) Appl. No.: 11/448,786

(22) Filed: Jun. 8, 2006

(65) Prior Publication Data

US 2007/0287101 A1 Dec. 13, 2007

(51) Int. Cl.
*G03F 7/00* (2006.01)
*H01L 21/00* (2006.01)

(52) U.S. Cl. ............... 430/311; 430/272.1; 430/273.1; 430/313; 216/58; 216/72

(58) Field of Classification Search ............ 430/311, 430/313, 272.1, 273.1; 216/58, 72
See application file for complete search history.

(56) References Cited

U.S. PATENT DOCUMENTS 5,472,564 A * 12/1995 Nakamura et al. ............ 216/51
5,686,223 A * 11/1997 Cleeves ....................... 430/312
2003/0096504 A1 * 5/2003 Ryu et al. .................... 438/694

OTHER PUBLICATIONS

Feb. 22, SPIE—The International Society of Optical Engineering—Annual Conference at San Jose, Session 11—"Double Exposure Technology Using Silicon Containing Materials", S. Lee et al. (6153-57).

* cited by examiner

*Primary Examiner*—Thorl Chea
(74) *Attorney, Agent, or Firm*—Volpe and Koenig, P.C.

(57) ABSTRACT

Ultrafine patterns with dimensions smaller than the chemical and optical limits of lithography are formed by superimposing two photoresist patterns using a double exposure technique. Embodiments include forming a first resist pattern over a target layer to be patterned, forming a protective cover layer over the first resist pattern, forming a second resist pattern on the cover layer superimposed over the first resist pattern while the cover layer protects the first resist pattern, selectively etching the cover layer with high selectivity with respect to the first and second resist patterns leaving an ultrafine target pattern defined by the first and second resist patterns, and etching the underlying target layer using the superimposed first and second resist patterns as a mask.

20 Claims, 6 Drawing Sheets

DOUBLE EXPOSURE TECHNOLOGY USING HIGH ETCHING SELECTIVITY

FIELD OF THE INVENTION

The present invention relates to the fabrication of semiconductor devices having closely spaced apart transistors and high speed integrated circuits with design features in the deep sub-micron range.

BACKGROUND ART

As the dimensions of semiconductor device features continue to shrink into the deep sub-micron range, as in the decananometer range, it becomes increasingly more difficult to form the features with high dimensional accuracy. The minimum size of a feature depends upon the chemical and optical limits of a particular lithography system, and the tolerance for distortions of the shape, such as corner rounding when forming negative features in a target layer or substrate.

Accordingly, a need exists for methodology enabling the fabrication of semiconductor devices having accurately formed features in the deep sub-micron range, such as features of 45 nm and under, in addition to features used for 65 nm technology and beyond, e.g., less than 90 nm half pitch, line end shortening, line-to-line printing and T-shape printing. There exists a particular need for such enabling methodology that can be performed efficiently, at low manufacturing cost, and in a single tool for high manufacturing throughput.

DISCLOSURE OF THE INVENTION

An advantage of the present invention is a method of fabricating semiconductor devices having accurately formed features with dimensions in the deep sub-micron range.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of fabricating a semiconductor device, the method comprising: forming a first resist pattern over a target layer; forming a cover layer over the first resist pattern; forming a second resist pattern on the cover layer over the first resist pattern leaving exposed portions of the cover layer; selectively etching to remove the exposed portions of the cover layer, leaving a target pattern defined by the first and second resist patterns; and etching the target layer using the target pattern as a mask.

Embodiments of the present invention include forming a cover layer that protects the first resist pattern from development during development of the second resist pattern, and which exhibits a high etch selectivity with respect to the first and second resist patterns, such as greater than about 1.5:1, e.g., about 5:1 to 150:1. Embodiments of the present invention further include the use a spin coatable dielectric or polymeric film as the cover layer, such as a silicon-containing antireflective film, e.g., a silicon-containing polymer.

Embodiments of the present invention further include forming the first and second resist patterns, from similar or different materials, such as a silicon-containing material, and selectively etching the cover layer with an oxygen ($O_2$) gas plasma. Embodiments of the present invention include the use of a dry etch recipe comprising argon (Ar), carbon tetrafluoride ($CF_4$) and oxygen ($O_2$), nitrogen ($N_2$) or carbon monoxide (CO), when employing a cover layer of a silicon-containing material, such as a silicon-containing polymer. Embodiments of the present invention include etching the target layer to form any of various device features, such as a plurality of closely spaced apart gate electrodes, damascene openings, and shallow trench isolation structures, advantageously in a single tool.

Additional advantages of the present invention will become readily apparent to those skilled in the art from the following detailed description, wherein embodiments of the present invention are described, simply by way of illustration of the best mode contemplated for carrying out the present invention. As will be realized, the present invention is capable of other and different embodiments and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

In FIGS. 1 through 6, similar features are denoted by like reference characters.

DESCRIPTION OF THE INVENTION

Figure 1:
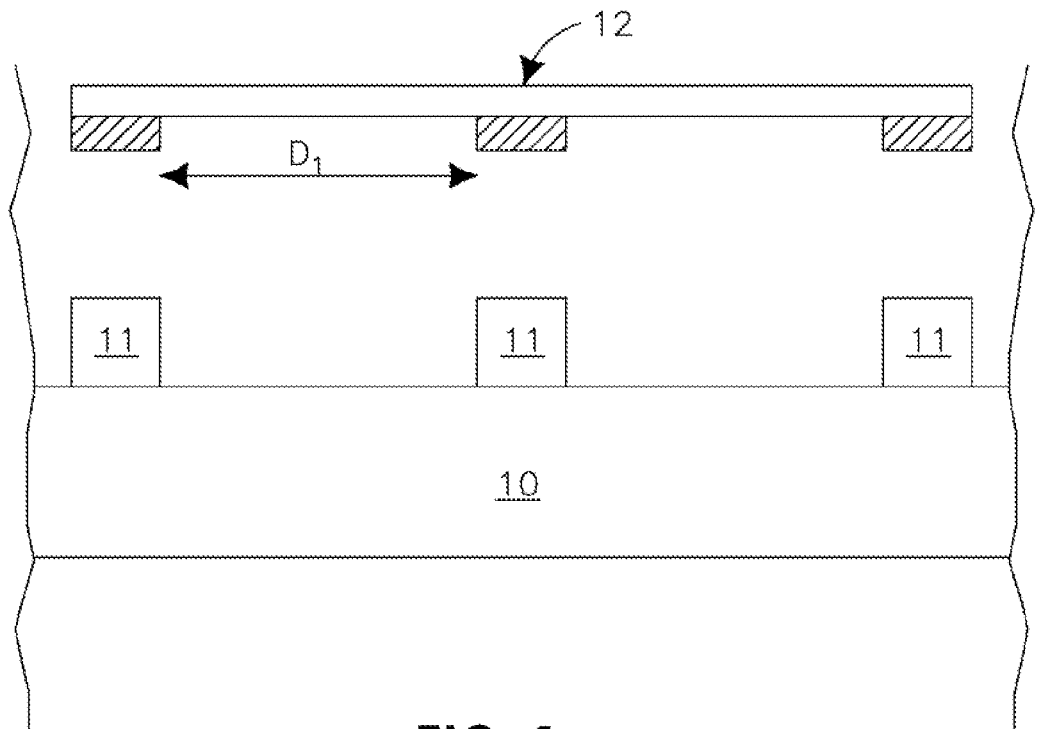
FIGS. 1 through 6 schematically illustrate sequential phases of a method in accordance with an embodiment of the present invention.

The present invention addresses and solves problems attendant upon fabricating semiconductor devices comprising features with accurately formed dimensions in the decananometer range, e.g., with device features of 45 nm and under, features used for 65 nm technology or beyond, such as len than 90 nm half pitch, line end shortening, line-to-printing, and T-shape printing. These problems stem from dimensional restrictions imposed by the chemical and optical limits of conventional lithography systems and distortions of feature shape, such as corner rounding when forming negative features in a target substrate. The present invention provides methodology enabling the formation of various types of semiconductors having such ultrafine features with high dimensional accuracy, in an efficient manner and in a single tool, thereby reducing manufacturing costs and increasing manufacturing throughput.

In accordance with embodiments of the present invention, a double exposure technique is employed using a plurality of resist patterns, which may comprise the same or different materials, and strategically providing a cover layer between such resist patterns. The cover layer is selected such that it protects an underlying resist pattern from development during formation of the overlying resist pattern, and such that it exhibits a very high etch selectivity with respect to the first and second resist patterns.

Embodiments of the present invention include forming a cover layer, as at a thickness of about 50 Å to about 3,000 Å, including about 100 Å to about 500 Å, such as about 200 Å to about 400 Å, e.g., about 300 Å, in a conformal manner over the first resist pattern. The second resist pattern is then formed on the cover layer. The exposed portions of the cover layer are then selectively etched. Embodiments of the present invention include the use of a cover layer which has an etch selectivity with respect to the first and second resist patterns, greater than about 1.5:1, such as about 5:1 to about 150:1.

In accordance with embodiments of the present invention, the first and second resist patterns each define features within the chemical and optical limits of conventional lithography systems. However, by superimposing the first and second resist patterns, a target mask is formed, comprising both the first and second resist patterns, defining features that are below the limits of conventional lithographic systems, such as gate electrodes spaced apart by a distance of 45 nm or less. Embodiments of the present invention are not limited to the use of two mask patterns but include the use of more than two mask patterns.

In accordance with embodiments of the present invention, conventional photoresist materials may be employed for the first and second mask patterns, and the cover layer can be a spin-coatable dielectric or polymeric film, including an antireflective film comprising a material such as a silicon-containing material. Suitable silicon-containing materials include silicon-containing polymers, such as an organosilicate copolymer. An example of an organosilicate copolymer is the Si-containing Hybrid BARC available from Dow Chemical Company and having the following structure:

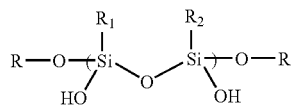

The above Hybrid BARC is characterized by a silicate backbone, wherein $R_1$ and $R_2$ groups are selected to optimize optical characteristics, the copolymer having a 193 to 193 nm absorbing species intrinsic to the copolymer structure. The copolymer typically contains about 30 wt. % silicon, about 28 wt. % oxygen, about 39 wt. % carbon and about 3 wt. % hydrogen.

The silicon-containing copolymer can typically be selectively etched with respect to first and second resist patterns formed of conventional resist materials, employing a dry etch recipe comprising Ar, $CF_4$ and any of $O_2$, $N_2$ or CO, at a very high etch rate with respect to the first and second resist patterns, such as an etch rate of about 5:1.

Embodiments of the present invention also include the use of silicon-containing photoresist materials for the first and second resist patterns, and a cover layer comprising various inorganic materials, such as a silicon nitride, organic materials, including antireflection coatings. An $O_2$ gas plasma can be used to etch the cover layer with a selectivity of greater than 15:1 with respect to the first and second resist patterns.

In accordance with embodiments of the present invention, the target layer can comprise silicon, e.g., polycrystalline silicon, a metal, such as copper or aluminum, and any of various dielectric materials conventionally employed in the fabrication of semiconductor devices, including various dielectric materials having a low dielectric constant (k) of about 3.9 and less.

An embodiment of the present invention is schematically illustrated in FIGS. 1 through 6. Adverting to FIG. 1, a first resist pattern 11 is formed on a target material 10, such as polycrystalline silicon, using mask 12 which contains a pattern wherein features are separated by distance $D_1$, within the limits of conventional lithographic systems.

Figure 2:
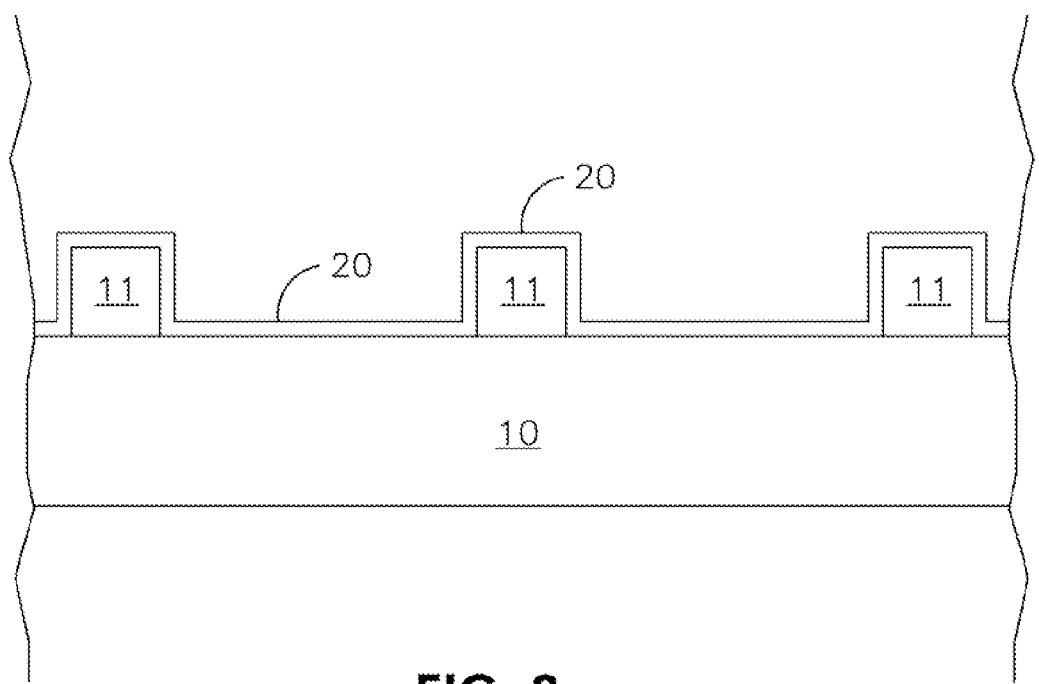

As illustrated in FIG. 2, cover layer 20, such as a silicon-containing antireflective film, is then conformally deposited over the first resist pattern, as at a thickness of about 50 Å to about 3,000 Å.

Figure 3:
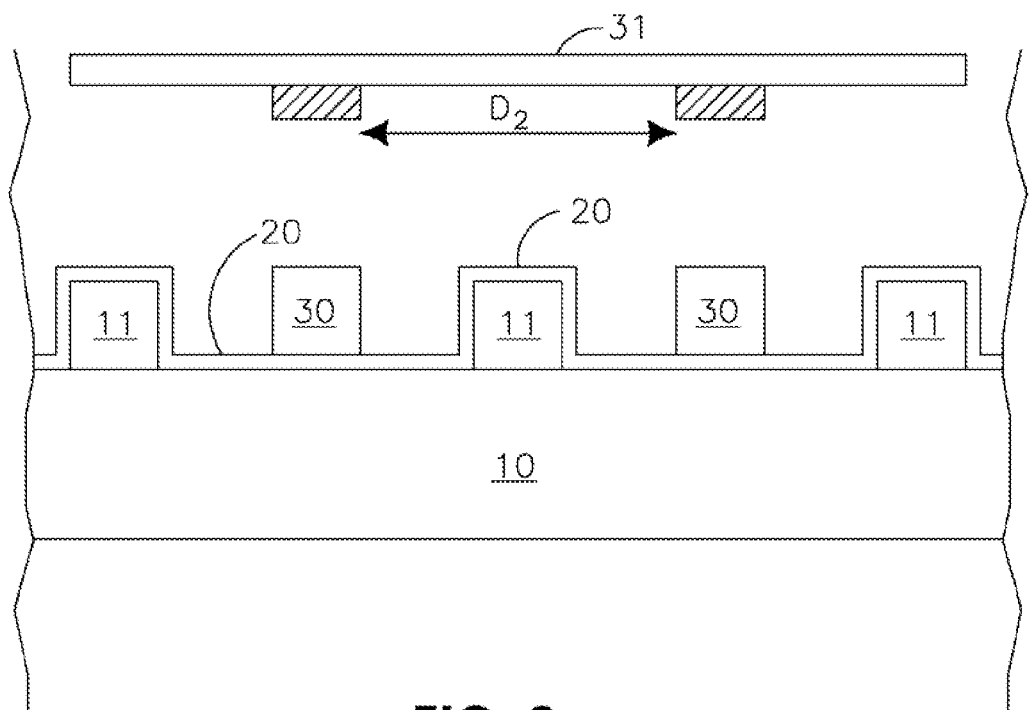

Subsequently, as illustrated in FIG. 3, a second resist pattern 30 is formed on cover layer 20 superimposed on first resist pattern 11, using mask 31 which defines a pattern of features spaced apart by a distance $D_2$ within the chemical and optical limits of conventional lithographic systems. The second resist pattern 30 may be formed by depositing a conventional photoresist material on cover layer 20, exposing the deposited layer using mask 31 and then developing to form mask pattern 30. During development to form mask pattern 30, cover layer 20 protects first resist pattern 11 from development, thereby maintaining its dimensional accuracy.

Figure 4:
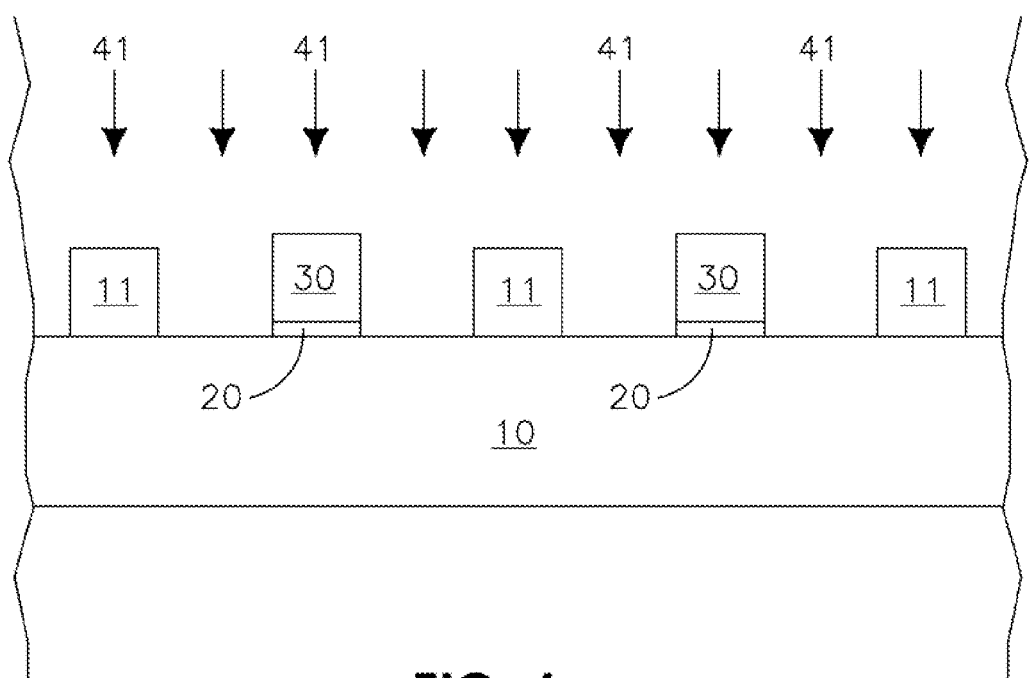

Subsequently, the exposed portions of cover layer 20 are selectively etched, as indicated by arrows 41 in FIG. 4. Cover layer 20 is selected from a material which exhibits a high etch selectivity vis-à-vis the first and second resist patterns 11, 30, such that the dimensional accuracy of the target mask comprising first and second resist patterns 11 and 30 is maintained. For example, cover layer 20 may be formed from a silicon-containing antireflective film, while the first and second resist patterns may be selected from conventional resist materials.

Figure 5:
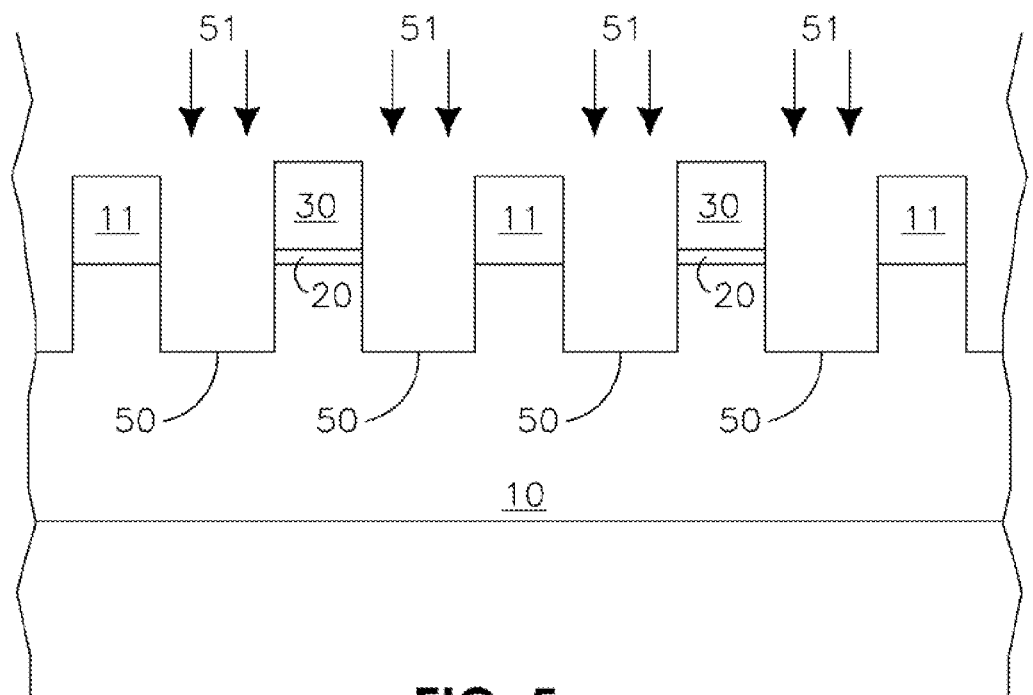
Figure 6:
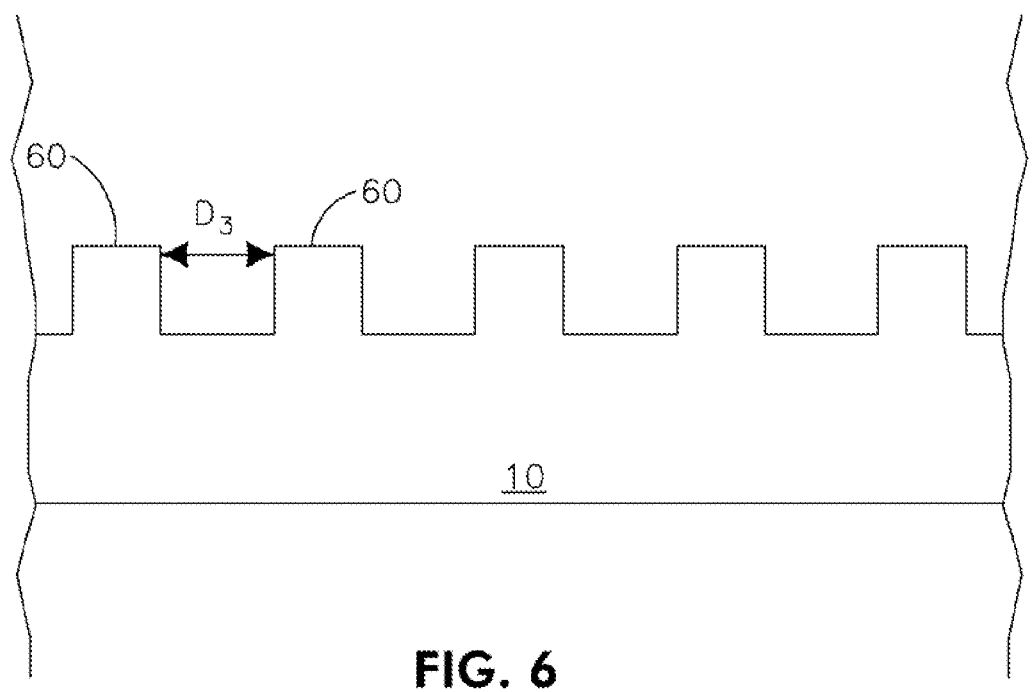

Adverting to FIG. 5, the target layer 10 is then etched, as indicated by arrows 51, using a mask formed by first and second resist patterns 11 and 30, resist pattern 30 also comprising a portion of cover layer 20 thereunder. Subsequently, the first and second resist patterns 11 and 30 are removed, along with the remaining portion of cover layer 20, resulting in the structure shown in FIG. 6 comprising a plurality of features 60 spaced apart by a distance $D_3$ which is smaller than $D_1$ and $D_2$ and less than the dimensions capable of being accurately formed by conventional lithographic systems. In addition, by employing a second resist pattern defining a specific pattern, such as T-shape, line-to-line, and line-end shortening, it is possible to generate a pattern that is extremely difficult to print using conventional lithographic systems.

Embodiments of the present invention include the use of any of various materials for target layer 10, dependent upon the particular device feature intended, such as polycrystalline silicon having an oxide layer thereon in forming gate electrode structures or a dielectric material when forming trenches therein, as in forming damascene openings or openings for shallow trench isolation structures.

The manipulative steps illustrated in FIGS. 1 through 6 can advantageously be performed in a single tool thereby providing high efficiency, low manufacturing cost and high manufacturing throughput. Embodiments of the present invention, therefore, enable the fabrication of semiconductor devices with features below the limits of conventional lithographic systems, such as features of 65 nm technology node and under, with high accuracy in an efficient manner with reduced manufacturing costs and high manufacturing throughput.

Figure 7A:
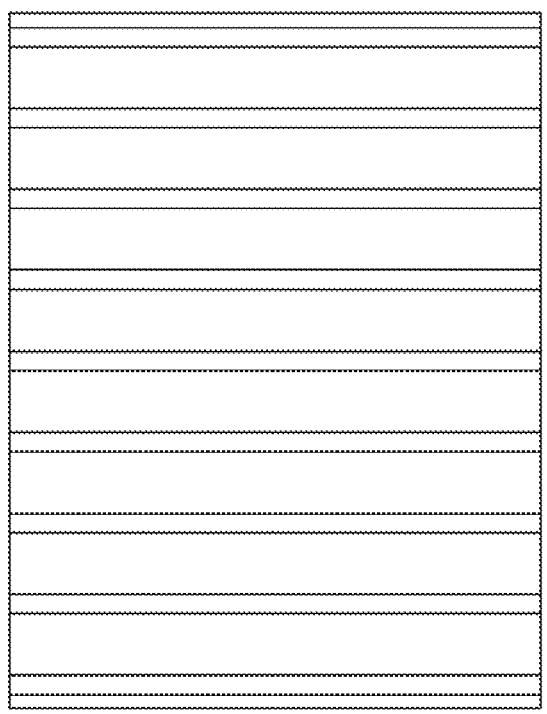
FIGS. 7A-7B are top-down views illustrating a frequency doubling embodiment of the present invention.
Figure 7B:
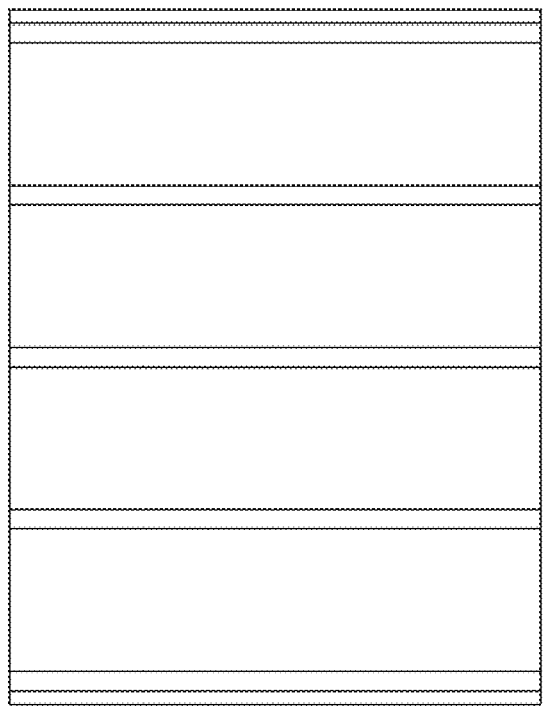
Figure 8A:
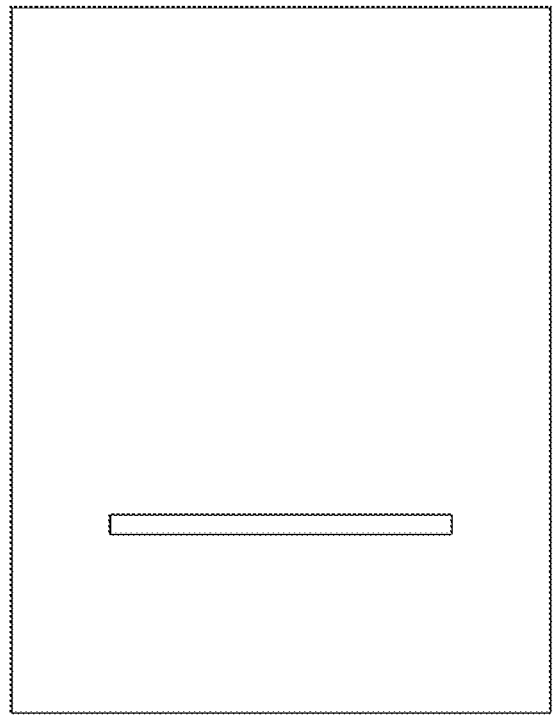
FIGS. 8A-8B are top-down views illustrating another embodiment of the present invention in forming a T-shape pattern.
Figure 8B:
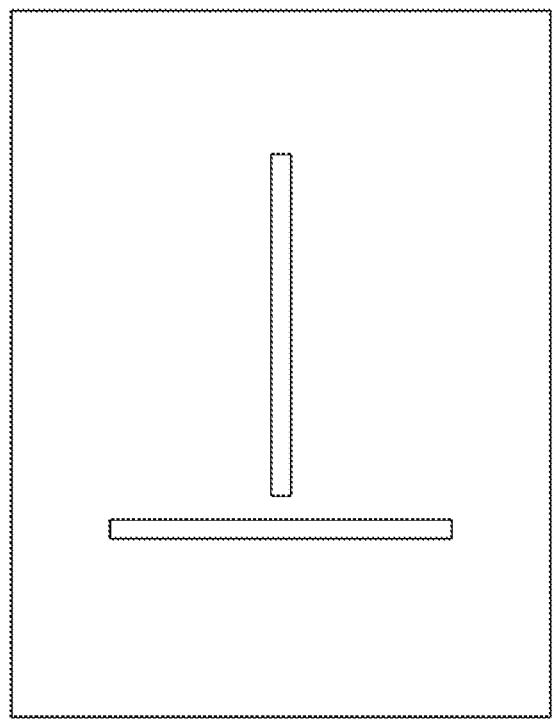
Figure 9B:
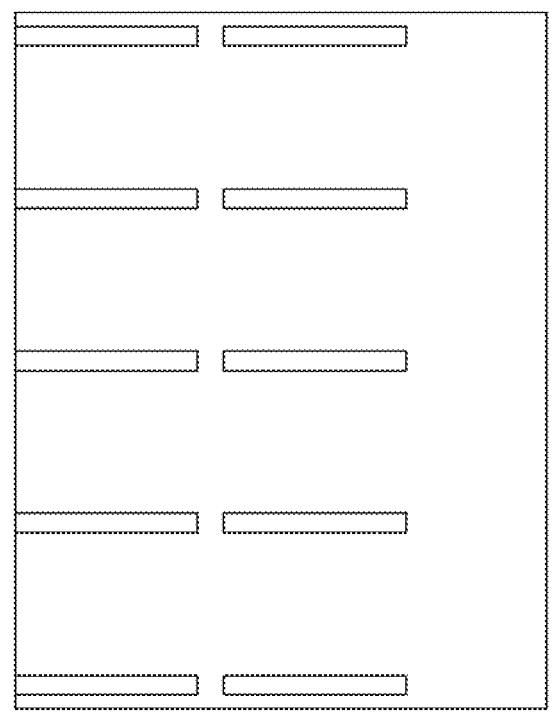
FIGS. 9A-9B are top-down views illustrating another embodiment of the present invention in forming a line-end pattern.
Figure 9A:
Figure 9A:
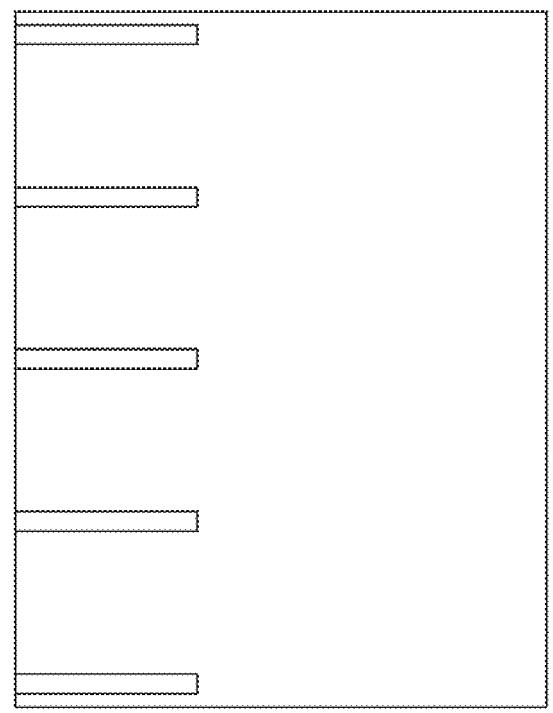

The present invention is not limited to forming linear patterns, such as parallel dense lines. The present invention enjoys utility in forming patterns of any shape, particularly patterns which are difficult to form using conventional lithography. Embodiments of the present invention advantageously include frequency doubling, as illustrated in FIG. 7A depicting a first mask pattern and FIG. 7B depicting a second mask pattern in which the frequency of a line pattern has been doubled. Embodiments of the present invention further include forming a T-shape pattern, as illustrated in FIG. 8A showing a first resist pattern and FIG. 8B showing the target T-shape pattern. Embodiments of the present invention further include line-end patterning, as illustrated in FIG. 9A depicting a first mask patterning and FIG. 9B depicting the target line-end pattern.

The present invention enjoys industrial applicability in fabricating any of various types of highly integrated semiconductor devices. The present invention enjoys particular applicability in fabricating flash memory semiconductor devices exhibiting increased circuit speed.

In the preceding description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not as restrictive. It is understood that the present invention is capable of using various other combinations and embodiments and is capable of any changes or modifications within the scope of the inventive concept as expressed herein.

What is claimed is:

1. A method of fabricating a semiconductor device, the method comprising:
   forming a first resist pattern over a target layer;
   forming a cover layer over the first resist pattern;
   forming a second resist pattern on the cover layer over the first resist pattern leaving exposed portions of the cover layer;
   selectively etching to remove the exposed portions of the cover layer, leaving a target pattern defined by the first and second resist patterns; and
   etching the target layer using the target pattern as a mask.

2. The method according to claim 1, comprising forming the cover layer from a material having an etch selectivity greater than 1.5:1 with respect to the first and second resist patterns.

3. The method according to claim 2, comprising forming the cover layer from a material having an etch selectivity of 5:1 to 150:1 with respect to the first and second resist patterns.

4. The method according to claim 3, wherein the etch selectivity is about 1.5:1 to about 500:1.

5. The method according to claim 1, comprising:
   depositing a resist layer on the cover layer and over the first resist pattern; and
   developing the resist layer to form the second resist pattern, wherein the cover layer protects the first resist pattern from development during formation of the second resist pattern.

6. The method according to claim 1, comprising forming the cover layer by depositing a spin coatable organic or inorganic film.

7. The method according to claim 6, comprising forming the cover layer by depositing a silicon-containing antireflective film.

8. The method according to claim 7, wherein the antireflective film comprises a silicon-containing polymer.

9. The method according to claim 8, comprising forming the cover layer by depositing an organosilicate copolymer solution.

10. The method according to claim 7, comprising selectively etching the cover layer with a dry etch recipe comprising argon (Ar), carbon tetrafluoride ($CF_4$) and oxygen ($O_2$), nitrogen ($N_2$) or carbon monoxide (CO).

11. The method according to claim 6, comprising:
    forming the first and second resist patterns from a silicon-containing material; and
    selectively etching the cover layer with an oxygen ($O_2$) gas plasma.

12. The method according to claim 1, comprising forming the first and second resist patterns from the same material.

13. The method according to claim 1, comprising forming the first and second resist patterns from different materials.

14. The method according to claim 1, comprising forming the cover layer as a conformal layer.

15. The method according to claim 14, comprising forming the cover layer at a thickness of about 50 Å to about 3,000 Å.

16. The method according to claim 1, wherein the target layer comprises silicon, a dielectric material, or a metal.

17. The method according to claim 1, comprising etching the target layer to form a pattern of gate electrodes and contact hole.

18. The method according to claim 17, comprising etching the target layer to form a pattern of gate electrodes spaced apart by a distance of less than about 45 nm.

19. The method according to claim 1, comprising forming the first and second resist patterns in the same tool.

20. The method according to claim 1, comprising etching the target layer to form a plurality of trenches, a T-shape pattern, a line-end pattern or line-to-line patterning.

* * * * *